United States Patent [19]
Sterzer

[11] Patent Number: 5,528,174
[45] Date of Patent: Jun. 18, 1996

[54] DEVICES FOR IMPLEMENTING MICROWAVE PHASE LOGIC

[76] Inventor: Fred Sterzer, 4432 Province Line Rd., Princeton, N.J. 08540

[21] Appl. No.: 209,264

[22] Filed: Mar. 14, 1994

[51] Int. Cl.$^6$ ............................................. H03K 19/00
[52] U.S. Cl. ........................ 326/99; 327/3; 327/355
[58] Field of Search ......................... 326/99; 327/3, 327/7, 8, 9, 12, 355, 28, 31, 165

[56] References Cited

U.S. PATENT DOCUMENTS

| | | | |
|---|---|---|---|
| 3,986,047 | 10/1976 | Griess | 307/269 |
| 4,638,188 | 1/1987 | Cray | 307/453 |
| 4,788,509 | 11/1988 | Bahl et al. | 307/511 |
| 4,994,773 | 2/1991 | Chen | 307/571 |
| 5,039,889 | 8/1991 | Janta | 327/3 |
| 5,252,865 | 10/1993 | Davenport | 328/127 |
| 5,294,841 | 3/1994 | Magarshack | 327/355 |
| 5,338,989 | 11/1994 | Taning | 307/571 |

OTHER PUBLICATIONS

Kleinfelder, W.; Parametron Logic Phase to Amplitude Converter, IBM Technical Disclosure Bulletin, vol. 5, #10, Mar. 1963.

*Primary Examiner*—Edward P. Westin
*Assistant Examiner*—Andrew Sanders

[57] ABSTRACT

Any one of several improved devices capable of implementing microwave phase logic (MPL) operating at gigabits per second rates comprises either at least one of means performing the function of a multigate microwave-monolithic-integrated-circuit (MMIC) field-effect transistor (FET), or a pair of doubly-balanced mixers, in which each of the mixers includes an RF port, a local-oscillator (LO) port and an IF port, and the IF port of a first of the doubly-balanced mixers is directly connected to the IF port of a second of the doubly-balanced mixers. The first of the doubly-balanced mixers is operative as a demodulator for deriving (1) a given polarity at its IF port in response to substantially in-phase signals of the same first specified frequency being respectively applied to its RF and LO ports and (2) a polarity opposite to the given polarity at its IF port in response to substantially out-of-phase signals of the same first specified frequency being respectively applied to its RF and LO ports, and the second of the doubly-balanced mixers is operative as a modulator for deriving (3) a signal of a given phase and second specified frequency at its RF port in response to a signal of the second specified frequency being applied to its LO port and the given polarity being applied its IF port and (4) a signal of a phase substantially 180° out-of-phase with the given phase and second specified frequency at its RF port in response to a signal of the second specified frequency applied to its LO port and the polarity opposite to the given polarity being applied its IF port.

10 Claims, 5 Drawing Sheets

FULL ADDER

EXCLUSIVE OR 5,528,174

DEVICES FOR IMPLEMENTING MICROWAVE PHASE LOGIC

This invention was made with Government support and the Government has certain rights to this invention.

BACKGROUND OF THE INVENTION

This invention relates to devices that may be used to implement a digital-information handling system that operates at gigabits per second rates (i.e., each bit occupies only a small fraction of a nanosecond) and, more particularly, to such devices that employ microwave phase logic (MPL) for this purpose.

Known approaches to binary encoding include (1) DC amplitude pulse (a binary "1" is represented by a first given voltage level and a a binary "0" is represented by a second given voltage level, which first and second given voltage levels may have either the same or different polarities depending on the standard logic family employed, one of the voltage levels may be zero); (2) RF pulse (a binary "1" is represented by an RF carrier modulated by a first given amplitude and a binary "0" is represented by an RF carrier modulated by a second given amplitude, wherein one of the two amplitudes may or may not be zero), and (3) biphase (both a binary "1", a binary "0" and a reference are all represented by the same RF carrier frequency of a certain amplitude with a specified one of the binary "1" and binary "0" being in-phase with the phase of the reference and the other of the binary "1" and binary "0" being 180° out-of-phase with the phase of the reference).

As is known, any of these three binary encoding approaches may be converted to one of the others. For instance, DC amplitude pulse encoding may be converted to RF pulse encoding by amplitude modulation and RF pulse encoding may be converted to DC amplitude pulse encoding by either envelope detection or heterodyning techniques. RF pulse encoding may be converted to biphase encoding by comparing it to an RF carrier which has the same frequency as it, is 180° out-of-and has an amplitude in between the first and second given amplitudes of it. Similarly, biphase encoding may be converted to RF pulse encoding by combining it with an RF carrier which has the same frequency as it, is in-phase with the phase representing a binary "1", and has a specified given amplitude no greater than the amplitude of the biphase coded signal.

In a digital-information handling system employing either DC amplitude pulse and RF pulse binary encoding is non-continuous in that it involves a switching time between successive bits during which the binary state represented by them may be changed. Therefore, logic devices employing DC amplitude pulse and RF pulse binary encoding for a baseband digital-information handling system, starting at or near DC and extending to microwave with a multi-gigahertz bandwidth would be very difficult to design. However, a multi-gigahertz bandwidth would be a moderate percentage of a relatively high continuous microwave carrier frequency (e.g., 16 GHz) that employs biphase coding.

The general idea of certain types of logic devices that make use of Microwave Phase Logic.(MPL) and are capable of being implemented by means of devices responsive to biphase-coded signals applied thereto, have been known for many years. As is known, MPL devices makes use of the relationship of the respective phases of one or more biphase-coded input signals relative to the phase of a reference signal to determine the phase of one or more biphase-coded output signals relative to the phase of the reference signal. Included among known MPL devices are NOT gates, AND gates, OR gates, NAND gates, NOR gates, full adders, comparators, etc. In addition, because it is essential that the respective amplitudes of biphase-coded signals and reference signal have one or more certain specified levels, it is known to employ limiting amplifiers as MPL devices to achieve and maintain these specified levels.

However, prior to the present invention, none of these certain types of MPL devices could be implemented by means of cost-effective, minature-sized, multigate digital microwave-monolithic-integrated-circuit (MMIC) field-effect transistors (FET) that operate at gigabit/second speed. Further, the present invention makes it possible for the first time to implement several other types of MPL logic devices that incorporate doubly balanced mixers operating at gigabit/second speeds. Doubly balanced mixers suitable for operation at gigabit/second speeds, per se, are part of the prior art and are described in some detail on pages 269–288 of the book entitled "Microwave Mixers", Second Edition, by Stephen A. Maas, published in 1993 by Artech House, Inc. Although limiting amplifiers employed as MPL devices operating at gigabit/second speeds may be implemented by means other than doubly balanced mixers, doubly balanced mixers are to be preferred.

SUMMARY OF THE INVENTION

Any one of several improved devices capable of implementing microwave phase logic (MPL) operating at gigabits per second rates comprises at least one of a multigate microwave-monolithic-integrated-circuit (MMIC) field-effect transistor (FET), and a pair of doubly-balanced mixers, in which each of the mixers includes an RF port, a local-oscillator (LO) port and an IF port, and the IF port of a first of the doubly-balanced mixers is directly connected to the IF port of a second of the doubly-balanced mixers. The first of the doubly-balanced mixers is operative as a demodulator for deriving (1) a given polarity at its IF port in response to substantially in-phase signals of the same first specified frequency being respectively applied to its RF and LO ports and (2) a polarity opposite to the given polarity at its IF port in response to substantially out-of-phase signals of the same first specified frequency being respectively applied to its RF and LO ports, and the second of the doubly-balanced mixers is operative as a modulator for deriving (3) a signal of a given phase and second specified frequency at its RF port in response to a signal of the second specified frequency being applied to its LO port and the given polarity being applied its IF port and (4) a signal of a phase substantially 180° out-of-phase with the given phase and second specified frequency at its RF port in response to a signal of the second specified frequency applied to its LO port and the polarity opposite to the given polarity being applied its IF port.

DESCRIPTION OF THE PREFERRED EMBODIMENTS

In accordance with known principles of MPL, majority logic is employed in implementing many types of logic devices, such as AND and OR gates for example. More specifically, an AND gate is implemented if both of two phase-coded signals of a given frequency carrier and amplitude (where a binary "1" and a binary "0" are respectively represented by phases of 0° and 180°) are combined with a reference signal of this given frequency carrier and amplitude having a phase representative of a binary "0". In this case, the combined output signal will have a phase representative of a binary "1" only if both of the two phase-coded signals have a have a phase representative of a binary "1". This is true because the 180° phase of the reference signal cancels the 0° phase of one of two phase-coded signals representative of a binary "1", so that the phase of the combined output signal will be representative of a binary "0" unless both of the two phase-coded signals are representative of a binary "1". Similarly, majority logic implements an OR gate with a reference signal having a phase representative of a binary "1".

Since many types of MPL devices, such as the above-described AND and OR gates, depend on the fact that the respective biphase signals employed thereby all have substantially equal amplitudes, and there is a tendency for the power and amplitude of biphase signals to be attenuated or otherwise changed in passing through an MPL device, at least one separate amplitude-limiting power amplifiers is often needed as a component of an MPL device.

MMIC FETs, having one or more gates, are particularly suitable for implementing an MPL device. Not only is an MMIC FET capable of operating with biphase signals employing microwave carrier frequencies (e.g., 16 GHz) at microwave bit rates (e.g., 4 GHz), but it is inherently capable of operating as a device that performs both a particular MPL function and an amplitude-limiting power amplifying function.

Figure 1:
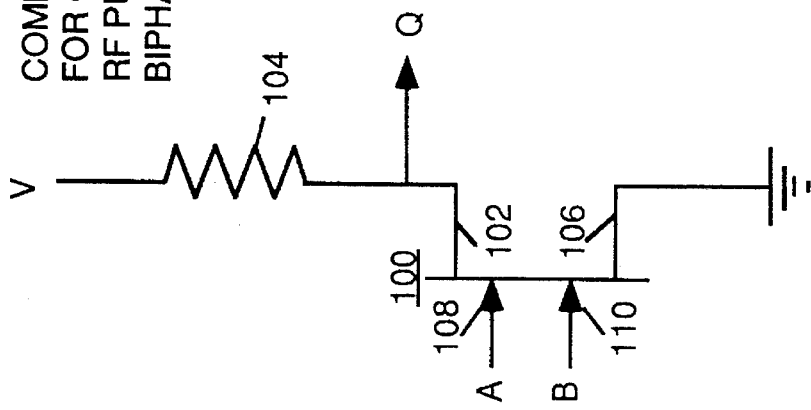
FIG. 1 illustrates a first MPL device comprising a multigate MMIC FET that is operative as a comparator for determining which one of two amplitude-modulated signals applied as inputs thereto has the higher amplitude.

Referring now to FIG. 1, there is shown a comparator circuit employing 2-gate MMIC FET 100 that is useful in implementing an MPL device for converting RF pulse code to biphase code. As shown, a point of given voltage potential V with respect to a point of reference potential is coupled to source 102 of MMIC FET 100 through load resistance 104 and drain 106 of MMIC FET 100 is coupled directly to the point of reference potential. Speaking generally, a first voltage signal A of a given microwave frequency (e.g., 16 GHz), a given phase (e.g., 0°) and a first amplitude is applied as an input to first gate 108 of MMIC FET 100, and a second voltage signal B of the same given microwave frequency, a phase (e.g., 180°) opposite to the given phase and a second amplitude is applied as an input to second gate 110 of MMIC FET 100. The phase of the current flowing through load resistance 104, which is a function of the difference in the respective amplitudes of voltage signals A and B, depends on whether the first amplitude of first voltage signal A is larger or smaller than the second amplitude of second voltage signal B. Taking into account the phase inversion that takes place between output signal Q of the comparator and the phase of of the difference in voltage signal amplitude inputs thereto, of output voltage signal Q will have the phase (i.e., 180°) of input voltage signal B when the amplitude of input voltage signal A is larger than that of input voltage signal B, and will have the phase (i.e., 0°) of voltage signal A when the amplitude of input voltage signal A is smaller than that of input voltage signal B. So long as the absolute value of the difference in amplitudes between input voltage signals A and B exceeds a given threshold value, MMIC FET 100 inherently operates to limit the amplitude of output voltage signal Q to a given fixed amplitude. Further, MMIC FET 100 inherently operates as a power amplifier.

Consider now the case in which input voltage signal A is an RF pulse-encoded voltage signal in which a binary "1" is represented by a relatively high-amplitude pulse modulation of a microwave carrier of a given phase and a binary "0" is represented by a relatively low-amplitude pulse modulation of the microwave carrier of the given phase, and input voltage signal B is a reference microwave carrier of a phase opposite to the given phase and of an amplitude in-between (preferably half-way in-between) the relatively high-amplitude and the relatively low-amplitude of voltage signal A, and the absolute value of both the difference between the relatively high-amplitude of voltage signal A and the reference amplitude of voltage signal B and the difference between the relatively low-amplitude of signal A and the reference amplitude of voltage signal B exceed the threshold value at which limiting occurs. In this case, the comparator of FIG. 1 operates to convert the RF pulse-encoded input voltage signal A into a biphase-encoded output voltage signal Q comprising a fixed-amplitude microwave carrier having either a certain phase that represents a binary "1" or a phase 180° out-of-phase with this certain phase that represents a binary "0" depending on whether the amplitude of voltage signal A is higher than or is lower than the reference amplitude of voltage signal B.

Figure 2:
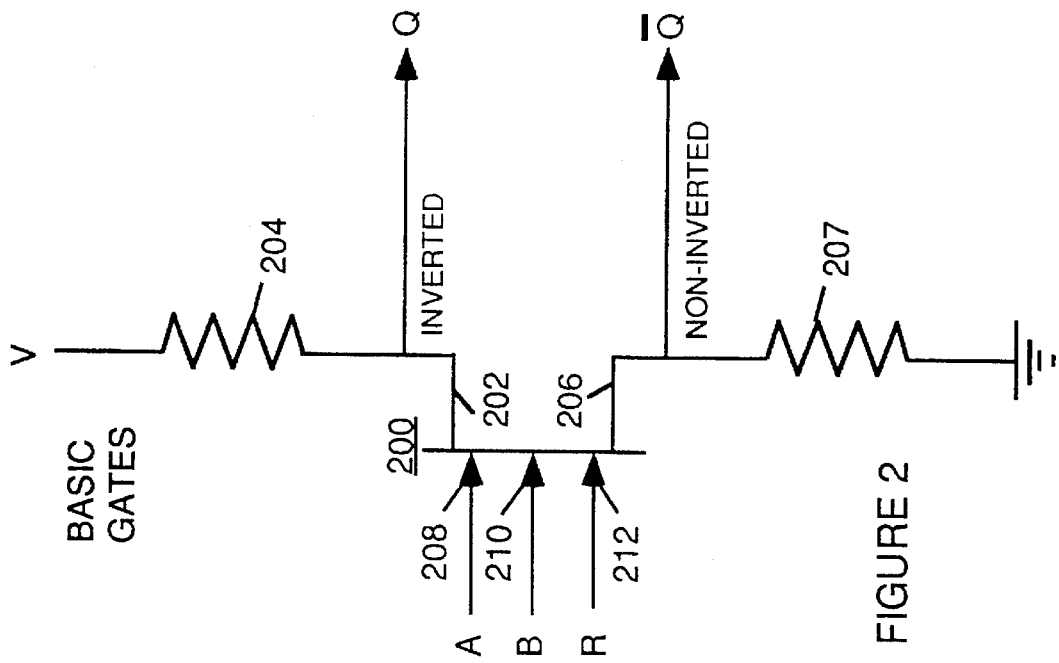
FIG. 2 illustrates a second MPL device comprising a multigate MMIC FET that is operative as any one of an AND gate, an OR gate, a NAND gate and a NOR gate.

Referring now to FIG. 2, there is shown a basic gate circuit employing 3-gate MMIC FET 200 that is useful in implementing an MPL device that can be alternatively operated as an AND gate, an NAND gate, an OR gate, or an NOR gate. As shown, a point of given voltage potential V with respect to a point of reference potential is coupled to source 202 of MMIC FET 200 through load resistance 204 and drain 206 of MMIC FET 200 is coupled to the point of reference potential through load resistance 207. A first biphase-encoded voltage signal A of a given amplitude is applied as an input to first gate 208 of MMIC FET 200, a second biphase-encoded voltage signal B of this same given amplitude is applied as an input to second gate 210 of MMIC FET 200, and a reference carrier voltage signal R of this same given amplitude and of a certain phase is applied as an input to third gate 212 of MMIC FET 200.

Assume for purposes of the following discussion that a binary "1" is represented by a biphase-encoded signal having a phase of 0° and a binary "0" is represented by a biphase-encoded signal having a phase of 180°.

To operate the basic gate circuit as a majority logic MPL biphase device performing as an AND gate, the certain phase of the applied reference carrier voltage signal R is 180° and the $\overline{Q}$ non-inverted output voltage signal from MMIC FET 200 constitutes the AND output. More specifically, when operated as an AND gate, the basic gate circuit is capable of canceling the effect of either one, but not both, of the biphase-encoded input voltage signals A and B applied thereto that represent a binary "1". Thus, the $\overline{Q}$ non-inverted output voltage signal from MMIC FET 200 has a phase of 0°, representing a binary "1", only if both of the biphase-encoded input voltage signals A and B represent binary "1"s. Otherwise, the $\overline{Q}$ non-inverted output voltage signal from MMIC FET 200 has a phase of 180°, representing a binary "0".

To operate the basic gate circuit as a majority logic MPL biphase device performing as an NAND gate, the certain phase of the applied reference carrier voltage Signal R is also 180°, but the Q inverted output voltage signal from MMIC FET 200 constitutes the NAND output. More specifically, when operated as an NAND gate, the basic gate circuit is still capable of canceling the effect of either one, but not both, of the biphase-encoded input voltage signals A and B applied thereto that represent a binary "1". Thus, the Q inverted output voltage signal from MMIC FET 200 has a phase of 180°, representing a binary "0", only if both of the biphase-encoded input voltage signals A and B represent binary "1"s. Otherwise, the Q inverted output voltage signal from MMIC FET 200 has a phase of 0°, representing a binary "1".

To operate the basic gate circuit as a majority logic MPL biphase device performing as an OR gate, the certain phase of the applied reference carrier voltage signal R is 0° and the $\overline{Q}$ non-inverted output signal from MMIC FET 200 constitutes the OR output. More specifically, when operated as an OR gate, the basic gate circuit is capable of canceling the effect of either one, but not both, of the biphase-encoded input signals A and B applied thereto that represent a binary "0". Thus, the $\overline{Q}$ non-inverted output voltage signal from MMIC FET 200 has a phase of 180°, representing a binary "0", only if both of the biphase-encoded input voltage signals A and B represent binary "0"s. Otherwise, the $\overline{Q}$ non-inverted output voltage signal from MMIC FET 200 has a phase of 0°, representing a binary "1".

To operate the basic gate circuit as a majority logic MPL biphase device performing as an NOR gate, the certain phase of the applied reference carrier voltage signal R is also 0°, but the Q inverted output voltage signal from MMIC FET 200 constitutes the NOR output. More specifically, when operated as an NOR gate, the basic gate circuit is still capable of canceling the effect of either one, but not both, of the biphase-encoded input signals A and B applied thereto that represent a binary "0". Thus, the Q inverted output signal from MMIC FET 200 has a phase of 0°, representing a binary "1", only if both of the biphase-encoded input voltage signals A and B represent binary "0"s. Otherwise, the Q inverted output voltage signal from MMIC FET 200 has a phase of 180°, representing a binary "0".

So long as the same given amplitude of each of the A, B and R input voltage signals in itself is sufficiently high to exceed the limiting threshold of MMIC FET 200, each of the respective inverted and non-inverted output amplitudes Q and $\overline{Q}$ will have a certain fixed level that is independent of the respective relative phases of each of the A, B, and R input voltage signals applied thereto with respect to one another. Further, MMIC FET 200 inherently operates as a power amplifier.

Figure 3:
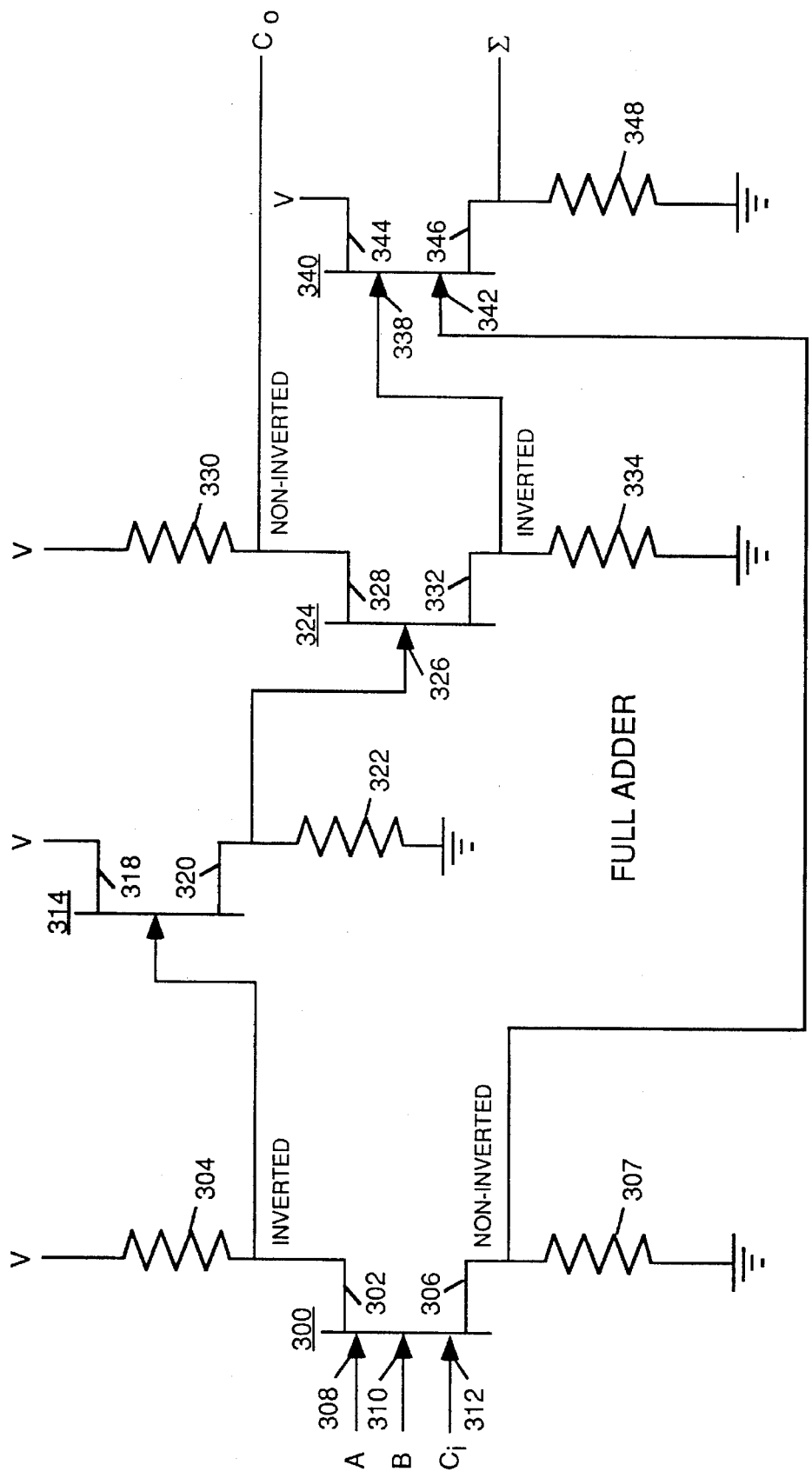
FIG. 3 illustrates a third MPL-device comprising multigate MMIC FETs that is operative as a first embodiment of a FULL ADDER.

Referring now to FIG. 3, there is shown an MPL device employing MMIC FETs that operates as a first implementation of a FULL ADDER of three biphase-encoded input signals representing the respective binary values of a first addend, a second addend and an input carry.

As shown in FIG. 3, a point of given voltage potential V with respect to a point of reference potential is coupled to source 302 of 3-gate MMIC FET 300 through load resistance 304 and drain 206 of MMIC FET 300 is coupled to the point of reference potential through load resistance 307. A first biphase-encoded voltage signal A of a given relatively-low amplitude representing the binary value of a first addend is applied as an input to first gate 308 of MMIC FET 300, a second biphase-encoded voltage signal B of the same given relatively-low amplitude representing the binary value of a second addend is applied as an input to second gate 310 of MMIC FET 300, and a biphase-encoded voltage signal $C_i$ signal of the same given relatively-low voltage amplitude representing the binary value of an input carry is applied as an input to third gate 312. More specifically, the same given amplitude of each of the A, B and $C_i$ biphase input voltage signals to MMIC FET 300 is sufficiently low so that even when all of these biphase input signals happen to be in phase with one another, they are still insufficient to drive MMIC FET 300 to the threshold point at which limiting takes place. The inverted output voltage of MMIC FET 300, appearing at the source thereof, is applied as an input to gate 316 of 1-gate MMIC FET 314. The point of given voltage potential V is coupled directly to source 318 of MMIC FET 314 to and drain 320 of MMIC FET 314 is coupled to the point of reference potential through load resistance 322. The output voltage of MMIC FET 314, appearing at the drain thereof, is applied as an input to gate 326 of 1-gate MMIC FET 324. The point of given voltage potential V is coupled to through load resistance 330 to and drain 332 of MMIC Flit 324 is coupled to the point of reference potential through load resistance 334. The inverted output voltage of MMIC FET 324, appearing at drain 332 thereof, is applied to first gate 338 of 2-gate MMIC FET 340 and the non-inverted output voltage of MMIC FET 300, appearing at drain 306 thereof, is applied to second gate 342 of 2-gate MMIC FET 340. Source 344 of MMIC FET 340 is coupled directly to the point of given voltage potential V and drain 346 of MMIC FET 340 is coupled to the point of reference potential through load resistance 348. The output voltage of MMIC FET 340, appearing at drain 346 thereof, constitutes the binary value of the sum output biphase voltage signal Σ from the FULL ADDER. The non-inverted output voltage of MMIC FET 324, appearing at source 328 thereof, constitutes the binary value of the carry output biphase voltage signal $C_o$ from the FULL ADDER.

Either all three of the biphase-encoded voltage input signals A, B and $C_i$ of the same given amplitude happen to be in phase with one another or, alternatively, the phase of a single one of the biphase encoded MMIC FET 300 of the same given amplitude happens to be out-of-phase with the opposite phase of each of the other two of the biphase-encoded voltage input signals A, B and $C_i$. In the latter case, the single voltage input signal will cancel one of the other two voltage input signals. Therefore, in this case, the amplitude of the source-drain current through MMIC FET 300 will be proportional to only the given amplitude of a single one of the voltage input signals A, B and $C_i$. However, in the case in which all three voltage input signals A, B and $C_i$ are in phase with one another, the amplitude of the source-drain current through MMIC FET 300 will be proportional to three times the given amplitude of a single one of the voltage input signals A, B and $C_i$. Therefore, the amplitude of the non-inverted output voltage of MMIC FET 300 derived across load resistance 307 in response to the amplitude of the source-drain current through MMIC FET 300 being proportional to three times the given amplitude of a single one of the voltage input signals A, B and $C_i$. will be three times higher in value than this amplitude will be in response to the amplitude of the source-drain current through MMIC FET 300 being proportional to only the given amplitude of a single one of the voltage input signals A, B and $C_i$. Preferably, the value of load resistance 307 should be selected to derive an amplitude of the non-inverted output voltage of MMIC FET 300 which is either 3 times or equal to the given amplitude.

Load resistance 304 has a value which is sufficient to derive an inverted output voltage amplitude from MMIC FET 300 that will drive MMIC FET 314 beyond its limiting threshold point even when the amplitude of the source-drain current through MMIC FET 300 is proportional to only the given amplitude of a single one of the voltage input signals A, B and $C_i$. Therefore, the amplitude of the output voltage of MMIC FET 314 derived across load resistance 322 has a fixed value that is independent of the source-drain current through MMIC FET 300. Therefore, the amplitude of the source-drain current through MMIC FET 324, which is driven by the the output voltage of MMIC FET 314 derived across load resistance 322, also has a fixed value that is independent of the source-drain current through MMIC FET 300.

Since the amplitude of the source-drain current through MMIC FET 324 has a fixed value, the amplitude of the non-inverted output voltage thereof (which constitutes the $C_o$ carry output voltage signal) depends on the value of load resistance 330 and the amplitude of the inverted output voltage thereof depends on the value of load resistance 334. Preferably, the value of load resistance 330 should be selected to derive an amplitude for the $C_o$. carry output voltage signal equal to the given amplitude of each of the voltage input signals A, B and $C_i$. However, the value of load resistance 334 is selected to derive a fixed-value amplitude for the inverted output voltage from MMIC FET 324, which is applied as the first input to MMIC FET 340, which is in-between the above-described "3 times" amplitude of the non-inverted output voltage of MMIC FET 300, which is applied as the second input to MMIC FET 340, and the "1 times" amplitude thereof. Preferably, the value of load resistance 334 should be selected to derive a fixed-value amplitude for the inverted output voltage from MMIC FET 324 which is "2" times" the amplitude of the non-inverted output voltage of MMIC FET 300.

MMIC FET 340 derives an output voltage (which constitutes the Σ sum output voltage signal) having the same phase as the phase of that one of the first and second voltage inputs thereto that has the higher amplitude. Thus, if the non-inverted output voltage of MMIC FET 300 has its "3 times" amplitude, the phase of the Σ sum output voltage signal from MMIC FET 340 will be the non-inverted phase of the second input thereto, but if the non-inverted output voltage of MMIC Flit 300 has its "1 times" amplitude, the phase of the Σ sum output voltage signal from MMIC FET 340 will be the inverted phase of the first input thereto. Further, the amplitude of the voltage difference between the respective voltages applied to the aforesaid first and second inputs of MMIC FET 340 may be made always sufficiently high to drive MMIC FET 340 beyond the threshold point at which limiting of the source-drain current of MMIC FET 340 occurs. Preferably, the value of load resistance 348 should then selected so as derive an amplitude for the Σ sum output voltage signal from MMIC FET 340 equal to the given amplitude of each of the voltage input signals A, B and $C_i$.

From the foregoing description of FIG. 3, it becomes apparent that if the phase of all three of the biphase-encoded A, B and $C_i$ input voltage signals is 180° (which represents a binary value of "0"), the phase of the Σ sum output voltage signal (which is non-inverted) is 180° (which represents a binary value of "0"), and if the phase of all three of the biphase-encoded A, B and $C_i$ input voltage signals is 0° (which represents a binary value of "1"), the phase of the non-inverted Σ sum output voltage signal is 0° (which represents a binary value of "1"). However, if the phase of two out of the three biphase-encoded A, B and $C_i$ input voltage signals is 180° which represents a binary value of "0"), the phase of the Σ sum output voltage signal (which is inverted) is 0° (which represents a binary value of "1"), and if the phase of all three of the biphase-encoded A, B and $C_i$ input voltage signals is 0° (which represents a binary value of "1"), the phase of the inverted Σ sum output voltage signal is 180° (which represents a binary value of "0").

Further, from the foregoing description of FIG. 3, it becomes apparent that the phase of the $C_o$ carry output voltage signal is always the non-inverted phase. Thus, if the phase of two out of the three or all three of the biphase-encoded A, B and $C_i$ input voltage signals is 180° (which represents a binary value of "0"), the non-inverted phase of the $C_o$ carry output voltage signal will also be 180° (representing a binary value of "0"). Similarly, if the phase of two out of the three or all three of the biphase-encoded A, B and $C_i$ input voltage signals is 0° (which represents a binary value of "1"), the non-inverted phase of the $C_o$ carry output voltage signal will also be 0° (representing a binary value of "1").

The respective binary values represented by the Σ sum output voltage signal and the $C_o$ carry output voltage signal, as a function of the respective binary values represented by the biphase-encoded A, B and $C_i$ input voltage signals, conform to the following known truth table for a FULL ADDER:

| A | B | $C_i$ | Σ | $C_o$ |
|---|---|---|---|---|
| 0 | 0 | 0 | 0 | 0 |
| 1 | 0 | 0 | 1 | 0 |
| 0 | 1 | 0 | 1 | 0 |
| 0 | 0 | 1 | 1 | 0 |
| 1 | 1 | 0 | 0 | 1 |
| 1 | 0 | 1 | 0 | 1 |
| 0 | 1 | 1 | 0 | 1 |
| 1 | 1 | 1 | 1 | 1 |

Figure 4:
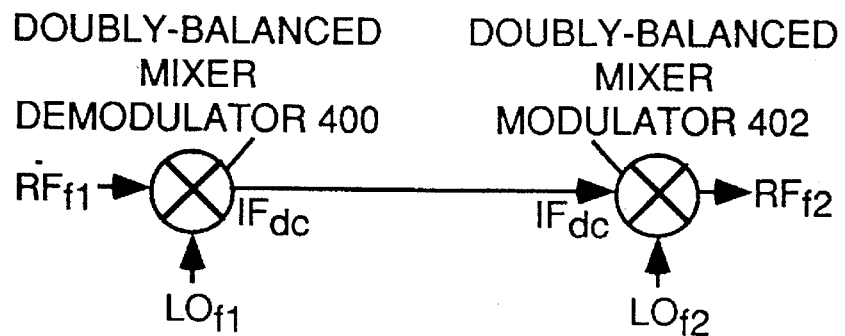
FIG. 4 illustrates the principles of a generalized MPL device employing first and second interconnected doubly-balanced mixers.

In accordance with the present invention, it has been found that a pair of interconnected doubly-balanced mixers are suitable for use as a component of each of several different MPL devices responsive to biphase-encoded signals. FIG. 4 illustrates the general principles embodied in such a pair of interconnected doubly-balanced mixers. Each of first and second doubly-balanced mixers 400 and 402, shown in FIG. 4, has a radio-frequency (RF) port, a local oscillator (LO) port, and an intermediate-frequency (IF) port, as known in the art.

A first signal $RF_{f1}$ of a first given frequency and a first phase is applied to the RF port of first doubly-balanced mixer 400 and a second signal $LO_{f1}$ of the same first given frequency and a second phase is applied to the LO port of first doubly-balanced mixer 400. Therefore, because the first and second signals have the same frequency, first doubly-balanced mixer 400 performs as a demodulator for deriving a DC signal $IF_{dc}$ at its IF port. If the first and second phases of the first and second signals are in-phase with one another, the DC signal $IF_{dc}$ will have a given polarity, but if the first and second phases of the first and second signals are 180° out-of-phase with one another, the DC signal $IF_{dc}$ will have a polarity opposite to the given polarity. The magnitude of the DC signal $IF_{dc}$ depends on the respective amplitudes of the first and second signals.

The DC signal $IF_{dc}$ derived at the IF port of first doubly-balanced mixer 400 is directly connected to the IF port of second doubly-balanced mixer 402 and a third signal $LO_{f2}$ of of a second given frequency is applied to the LO port of second doubly-balanced mixer 402. The first and second given frequencies either may be the same as one another or may be different from one another. Therefore, second doubly-balanced mixer 402 performs as a modulator for deriving fourth signal $RF_{f2}$ of the second given frequency and a phase determine by the polarity of DC signal $IF_{dc}$ at its RF port. The amplitude of fourth signal $RF_{f2}$ depends on the magnitude of DC signal $IF_{dc}$ and the amplitude of third signal $LO_{f2}$.

Figure 5:
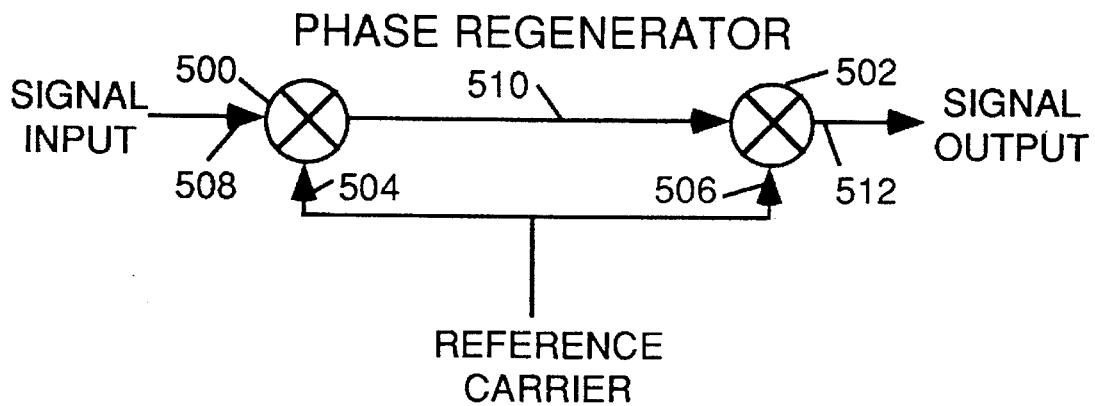
FIG. 5 illustrates the principles of a fourth MPL device employing first and second interconnected doubly-balanced mixers operative as a phase regenerator.

Each of FIGS. 5 to 9 shows a different one of various MPL devices that employs the above-described principles of FIG. 4. In FIG. 5, which operates as a phase regenerator, a reference carrier frequency of a given phase is applied both to LO port 504 of demodulator doubly-balanced mixer 500 and LO port 506 of modulator doubly-balanced mixer 502, while a biphase-encoded signal input of the same frequency as the reference carrier frequency is applied to RF port 508 of demodulator doubly-balanced mixer 500. If the phase of the biphase-encoded signal input is in-phase with the given phase of the reference carrier frequency (or, at least, is less than 90° out-of-phase therewith), the DC signal on interconnected IF ports 510 of demodulator and modulator balanced mixers 500 and 502 will have a given polarity, while if the phase of the biphase-encoded signal input is 180° out-phase with the given phase of the reference carrier frequency (or, at least, is more than 90° out-of-phase therewith), the DC signal on interconnected IF ports 510 of demodulator and modulator balanced mixers 500 and 502 will have a polarity opposite to the given polarity. In response to the DC signal on interconnected IF ports 510 having the given polarity, the signal output derived at RF port 512 of modulator balanced mixer 502 will have the frequency and given phase of the reference carrier frequency, while in response to the DC signal on interconnected IF ports 510 having a polarity opposite to the given polarity, the signal output derived at RF port 512 of modulator balanced mixer 502 will have the frequency and a phase 180° out-of phase with the given phase of the reference carrier frequency. Thus, even if the phase of the biphase-encoded signal at the RF input of demodulator balanced mixer 500 happens to be shifted somewhat from its proper nominal phase (i.e., a phase which is either 0° or 180° with respect to the given phase of the reference carrier frequency), the phase regenerator of FIG. 5 operates to restore the biphase-encoded signal to its proper nominal phase at the RF output of modulator balanced mixer 502.

While it is conventional in performing MPL phase regeneration for the same reference carrier frequency to be applied to both LO port 504 of demodulator doubly-balanced mixer 500 and LO port 506 of modulator doubly-balanced mixer 502, as shown in FIG. 5, this is not essential. The frequency f2 of a biphase-encoded output signal derived from modulator doubly-balanced mixer 502 may be shifted with respect to the frequency f1 of a biphase-encoded input signal applied to demodulator doubly-balanced mixer 500 without affecting the phase-regenerating function of FIG. 5 by employing a first reference carrier frequency f1 for demodulator doubly-balanced mixer 500 and a second reference carrier frequency f2 for modulator doubly-balanced mixer 502, as shown in FIG. 4.

Figure 6:
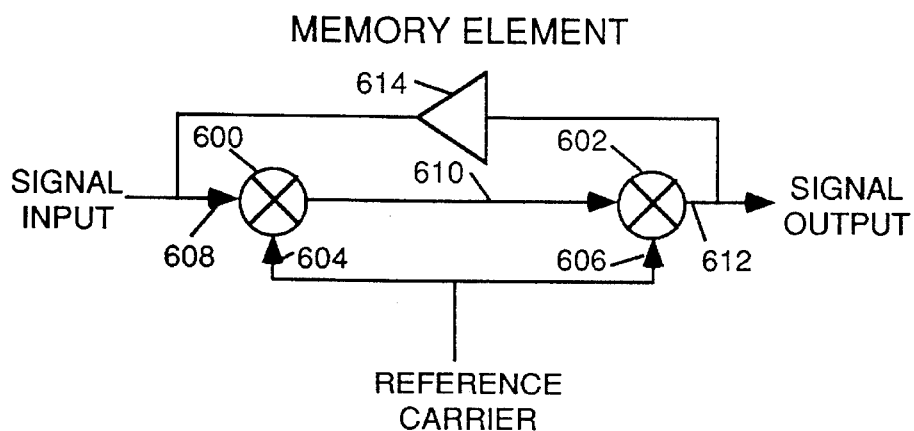
FIG. 6 illustrates the principles of a fifth MPL device employing first and second interconnected doubly-balanced mixers operative as a memory element.

FIG. 6 shows an MPL device which operates as a memory element for dynamically storing a transient burst of a biphase-encoded signal applied as an input thereto for an indefinite time. FIG. 6 includes as components thereof demodulator doubly-balanced mixer 600 and modulator doubly-balanced mixer 602, having interconnected IF ports 610, which correspond in structure and function to above-described interconnected demodulator doubly-balanced mixer 500 and modulator doubly-balanced mixer 502 of FIG. 5. More specifically, a transient burst of a biphase-encoded signal is applied as an input to RF port 608 of demodulator doubly-balanced mixer 600; a reference carrier frequency is applied to both LO port 604 of demodulator doubly-balanced mixer 600 and LO port 606 of modulator doubly-balanced mixer 602; and a signal output is derived from RF port 612 of modulator doubly-balanced mixer 602. The memory element of FIG. 6 further includes amplifier 614 for feeding back the signal output at RF port 612 to the signal input at RF port 608. Preferably, amplifier 614 is implemented with MMIC FETs, although this is not essential.

Initially, a transient burst of a biphase-encoded output signal is derived at RF port 612 of modulator doubly-balanced mixer 602 that has a certain phase (0° or 180°) determined by the particular phase of the transient burst of the biphase-encoded signal applied as an input to RF port 608 of demodulator doubly-balanced mixer 600 (in the manner discussed above in connection with FIG. 5). The amplified biphase-encoded output signal fed back as a signal input to demodulator doubly-balanced mixer 600 is in-phase with the particular phase of the transient burst of the biphase-encoded signal (or, at least, less than 90° out-of-phase therewith). In this manner, the memory element of FIG. 6 results a continuously recirculating biphase-encoded signal therethrough that appears at RF port 612 as a continuous output signal having the aforesaid certain phase.

The memory element of FIG. 6 is capable of dynamically storing only a single binary value as a biphase-encoded signal. However, a plurality of such memory elements can be combined in an array to provide a memory of any desired size.

FIG. 6 illustrates the case where it is necessary in an MPL data processing system to briefly sample the phase of a biphase write pulse signal, and continue thereafter to produce a signal of the phase of the sampled signal for an indefinite period. However, there are other applications in MPL systems which do not require long-term storage of the phase information, but merely retention of the sampled phase for a single bit period. For example, this is the case where pipeline registers are used to restore a distorted signal (due to bandlimiting) to a valid biphase signal for the full bit period, and where the biphase signal is to be clocked on every bit period. In this latter case, it is not necessary to use a circuit of the complexity of the above-described MPL memory element shown in FIG. 6. Instead, in this latter case, the simpler sample-and-hold circuit shown in FIG. 7 is to be preferred.

Figure 7:
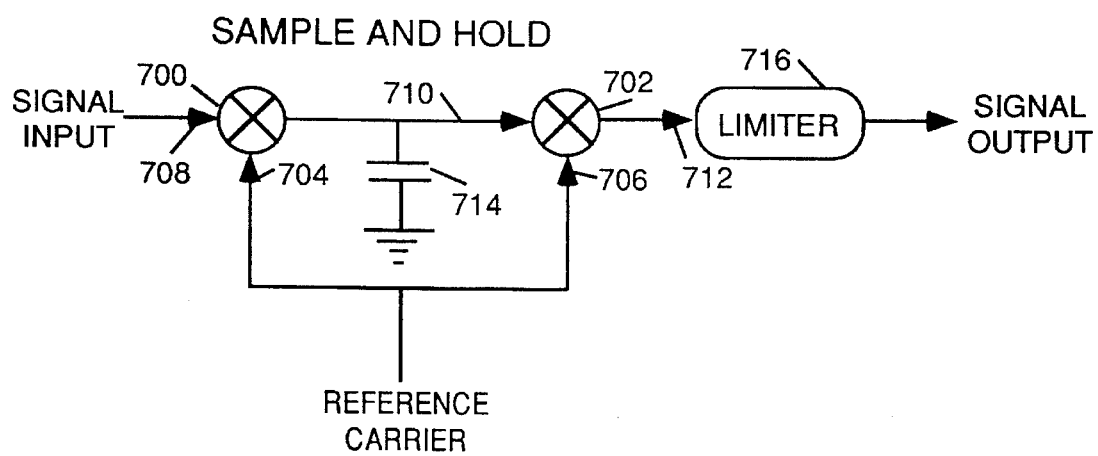
FIG. 7 illustrates the principles of a sixth MPL device employing first and second interconnected doubly-balanced mixers operative as a sample and hold circuit.

The sample-and-hold circuit of FIG. 7 includes as components thereof demodulator doubly-balanced mixer 700 and modulator doubly-balanced mixer 702, having interconnected IF ports 710, which correspond in structure and function to above-described interconnected demodulator doubly-balanced mixer 500 and modulator doubly-balanced mixer 502 of FIG. 5. The sample-and-hold circuit of FIG. 7 is like the memory element circuit of FIG. 6 only to the extent that a transient burst of a biphase-encoded signal is applied as an input to RF port 708 of demodulator doubly-balanced mixer 700, and a reference carrier frequency is applied to both LO port 704 of demodulator doubly-balanced mixer 700 and LO port 706 of modulator doubly-balanced mixer 702. However, in FIG. 7, the polarity of the DC signal present on interconnected IF ports 710 is temporarily stored for a bit period by a small capacitance 714 and the signal output from the sample-and-hold circuit is derived by passing the output from RF port 712 of modulator doubly-balanced mixer 702 through amplitude limiter 716. Preferably, amplitude limiter 716 is implemented with MMIC FETs, although this is not essential.

In the operation of the FIG. 7 sample-and-hold circuit, the DC signal polarity is retained on interconnected IF ports 710 for a while after the input transient burst of biphase-encoded signal has disappeared. However, the magnitude of the DC signal on interconnected IF ports 710 exponentially decreases until capacitance 714 either has completely discharged or has been charged again with one or the other DC polarity. Amplitude limiter 716 is used to make the signal output amplitude from the sample-and-hold circuit uniform.

Figure 8:
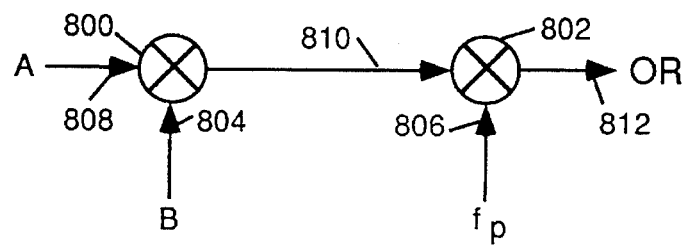
FIG. 8 illustrates the principles of a seventh MPL device employing first and second interconnected doubly-balanced mixers operative as an EXCLUSIVE OR gate.

FIG. 8 is directed to an MPL device that operates as an EXCLUSIVE OR circuit. FIG. 8 includes as components thereof demodulator doubly-balanced mixer 800 and modulator doubly-balanced mixer 802, having interconnected IF ports 810, which correspond in structure and function to above-described interconnected demodulator doubly-balanced mixer 500. As shown, first biphase-encoded signal A of a given frequency is applied as an input to RF port 808 and a second biphase-encoded signal B of the same given frequency is applied as an input to LO port 804 of demodulator doubly-balanced mixer 800. A pump frequency $f_p$ (which, alternatively, may be either the same or different from the given frequency) is applied to LO port 806 of modulator doubly-balanced mixer 802. The frequency of the OR output from FIG. 8, which appears at RF port 812 of modulator doubly-balanced mixer 802, is the same as pump frequency $f_p$.

If the the respective phases of both first and second biphase-encoded signals A and B are the same as one another (or, at least, differ from one another by less than 90°), the DC signal on interconnected IF ports 810 will have a given polarity. However, if the the respective phases of both first and second biphase-encoded signals A and B are opposite to one another (or, at least, differ from one another by more than 90°), the DC signal on interconnected IF ports 810 will have a polarity opposite to the given polarity. The phase of the OR output from modulator doubly-balanced mixer 802 is determined by the polarity of the DC signal on interconnected IF ports 810. If the phase of the OR output corresponding to the given polarity is used to represent a binary "0" and the phase of the OR output corresponding to a polarity opposite to the given polarity is used to represent a binary "1", the respective binary values represented by the OR output signal, as a function of the respective binary values represented by the biphase-encoded A and B input signals, conform to the following known truth table for an EXCLUSIVE OR circuit:

| A | B | OR |
|---|---|----|
| 0 | 0 | 0 |
| 1 | 0 | 1 |
| 0 | 1 | 1 |
| 1 | 1 | 0 |

Figure 9:
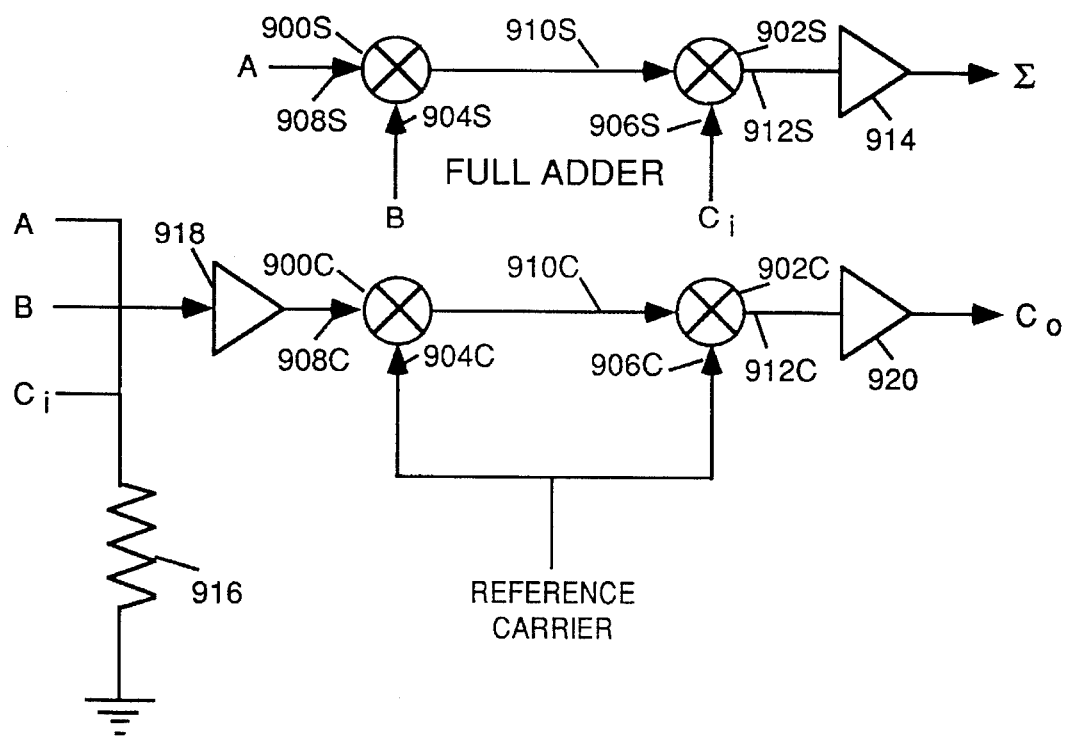
FIG. 9 illustrates the principles of an eighth MPL device employing first and second interconnected doubly-balanced mixers operative as a second embodiment of a FULL ADDER.

FIG. 9 shows a second embodiment of an MPL FULL ADDER device responsive to a first biphase-encoded input signal representing addend A, a second biphase-encoded input signal representing addend B, and a a third biphase-encoded input signal representing input-carry $C_i$ for deriving sum ($\Sigma$) output signal and output-carry $C_o$ signal. The FULL ADDER of FIG. 9 comprises first and second separate circuits each responsive to the three biphase-encoded input signals. The first circuit, which derives sum ($\Sigma$) output signal, performs an EXCLUSIVE OR function similar to that shown in above-described FIG. 8. The second circuit, which derives output-carry $C_o$ signal, makes use of majority-logic in combining the three biphase-encoded input signals.

The first circuit of FIG. 9 comprises demodulator doubly-balanced mixer 900S and modulator doubly-balanced mixer 902S, having interconnected IF ports 910S, that correspond in structure and function to above-described interconnected demodulator doubly-balanced mixer 500. Addend A input signal is applied to RF port 908S and addend input signal B is applied to LO port 904S of demodulator doubly-balanced mixer 900S. Input-carry $C_i$ signal is applied to LO port 906S of modulator doubly-balanced mixer 902S and sum ($\Sigma$) output signal is derived The output at RF port 912S of modulator doubly-balanced mixer 902S, after passing through amplifier 914, constitutes sum ($\Sigma$) output signal of the first circuit of the FULL ADDER. The respective binary values represented by the sum ($\Sigma$) output signal of the first circuit of the FULL ADDER, as a function of the respective binary values represented by the biphase-encoded A, B and $C_i$ input signals, conform to the following known truth table for the sum ($\Sigma$) output signal of a FULL ADDER:

| A | B | $C_i$ | $\Sigma$ |
|---|---|-------|----------|
| 0 | 0 | 0 | 0 |
| 1 | 0 | 0 | 1 |
| 0 | 1 | 0 | 1 |
| 0 | 0 | 1 | 1 |
| 1 | 1 | 0 | 0 |
| 0 | 1 | 1 | 0 |
| 1 | 0 | 1 | 0 |
| 1 | 1 | 1 | 1 |

An advantage of this first circuit of the second embodiment of the FULL ADDER shown in FIG. 9 is that the relative amplitudes of the A, B and $C_i$ input signals thereto need not necessarily be the same as one another. However, if they are the same as one another, the amplitude of the output at RF port 912S of modulator doubly-balanced mixer 902S will be the same as one another for all of the eight possible binary values, shown above, of the A, B and $C_i$ inputs to the first circuit. Should any of the A, B and $C_i$ inputs to the first circuit be different from one another, amplifier 914 may be operated as an amplitude limiter to insure that the sum ($\Sigma$) output signal has a fixed amplitude that is independent of the relative amplitudes of the A, B and $C_i$ input signals to the first circuit. Preferably, amplifier 914 is implemented with MMIC FETs, although this is not essential.

Unlike the first circuit of the second embodiment of the FULL ADDER shown in FIG. 9 for computing the sum (Σ) output signal, the second circuit thereof for computing the $C_o$ output signal requires that the relative amplitudes of the A, B and $C_i$ input signals thereto be the same as one another. More specifically, this second circuit comprises demodulator doubly-balanced mixer 900C and modulator doubly-balanced mixer 902C, having interconnected IF ports 910C, that correspond in structure and function to above-described interconnected demodulator doubly-balanced mixer 500. The A, B and $C_i$ biphase-encoded, equal-amplitude input signals to the second circuit of FIG. 9 are combined by resistance 916 and applied as a single input to amplifier 918, and the output from amplifier 918 is applied as an input signal to RF port 908C of demodulator doubly-balanced mixer 900C. Should the phase of all three of the A, B and $C_i$ signals happen to be the same as one another, the amplitude of the single input to amplifier 918 will be three times as large as the equal amplitude of each one of these three signals. However should the phase of one of the three of the A, B and $C_i$ signals happen to be opposite to the other two, the amplitude of the single input to amplifier 918 will be the same as the equal amplitude of each one of these three signals. Amplifier 918 is operated as an amplitude limiter to insure that the input signal to RF port 908C of demodulator doubly-balanced mixer 900C has a fixed amplitude which is independent of the variable amplitude of of the single input to amplifier 918.

A reference carrier is applied both to LO port 904C of demodulator doubly-balanced mixer 900C and LO port 906C of modulator doubly-balanced mixer 902C, and the output from RF port 912C of modulator doubly-balanced mixer 902C, after passing through amplifier 920, constitutes the output-carry $C_o$ signal from the second circuit of the second embodiment of the FULL ADDER shown in FIG. 9. Amplifier 920, like amplifier 918, may also be operated as an amplitude limiter. Preferably, both amplifiers 918 and 920 are implemented with MMIC FETs, although this is not essential.

The respective binary values represented by the output-carry $C_o$ signal of the second circuit of the FULL ADDER, as a function of the respective binary values represented by the biphase-encoded A, B and $C_i$ input signals, conform to the following known truth table for the output-carry $C_o$ signal of a FULL ADDER:

| A | B | $C_i$ | $C_o$ |
|---|---|---|---|
| 0 | 0 | 0 | 0 |
| 1 | 0 | 0 | 0 |
| 0 | 1 | 0 | 0 |
| 0 | 0 | 1 | 0 |
| 1 | 1 | 0 | 1 |
| 0 | 1 | 1 | 1 |
| 1 | 0 | 1 | 1 |
| 1 | 1 | 1 | 1 |

In the following claims, two signals of the same frequency which have identical phases or differ in phase from one another by less than 90° are considered to be substantially in-phase with one another and two signals of the same frequency which are 180° out-of-phase or differ in phase from one another by more than 90° are considered to be substantially out-of-phase with one another.

Although, as described above, cost-effective, minaturesized, multigate digital microwave-monolithic-integrated-circuit (MMIC) field-effect transistors (FET) that operate at gigabit/second speed are to be preferred in the implementation of the present invention, each of such multigate field-effect transistors may be replaced by a plurality of serially-connected single gate field-effect transistors that perform the same function. Further, while biphase encoding is employed in the implementation of MPL devices in the preferred embodiments of the present invention described above, the present invention is intended to extend to similar MPL devices using other forms of multiphase encoding, such as quadraphase encoding, for instance.

What is claimed is:

1. In a device capable of implementing microwave phase logic (MPL) operating at gigabits per second rates, the improvement wherein said device comprises:

a pair of doubly-balanced mixers, wherein each of said mixers includes an RF port, a local-oscillator (LO) port and an IF port, and said IF port of a first of said doubly-balanced mixers is directly connected to said IF port of a second of said doubly-balanced mixers;

whereby said first of said doubly-balanced mixers is operative as a demodulator for deriving (1) a given polarity at its IF port in response to substantially in-phase signals of the same first specified frequency being respectively applied to its RF and LO ports and (2) a polarity opposite to said given polarity at its IF port in response to substantially out-of-phase signals of the same first specified frequency being respectively applied to its RF and LO ports, and said second of said doubly-balanced mixers is operative as a modulator for deriving (3) a signal of a given phase and second specified frequency at its RF port in response to a signal of said second specified frequency being applied to its LO port and said given polarity being applied its IF port and (4) a signal of a phase substantially 180° out-of-phase with said given phase and second specified frequency at its RF port in response to a signal of said second specified frequency applied to its LO port and said polarity opposite to said given polarity being applied its IF port.

2. The device defined in claim 1, further comprising:

first means for applying a biphase-encoded signal of said first specified frequency as an input to said RF port of said first of said doubly-balanced mixers;

second means for applying a reference carrier of said first specified frequency and a first specified phase as an input to said LO port of said first of said doubly-balanced mixers and applying a reference carrier of said second specified frequency and a second specified phase as an input to said LO port of said second of said doubly-balanced mixers; and third means for extracting an output signal of said second specified frequency from said RF port of said second of said doubly-balanced mixers having a phase determined by the phase of said biphase-encoded signal which is either substantially in-phase or substantially 180° out-of-phase with said second specified phase.

3. The device defined in claim 2, wherein:

each of said first and second specified frequencies have the same given frequency; and each of said first and second specified phases of the reference carriers applied respectively to said LO port of said first of said doubly-balanced mixers and to said LO port of said second of said doubly-balanced mixers have the same given phase;

whereby said device operates as an MPL phase regenerator.

4. The device defined in claim 3, wherein:

said biphase-encoded signal applied by said first means as an input to said RF port of said first of said doubly-balanced mixers is in the form of a transient burst of said first specified frequency; and said device further comprises an amplifier for feeding back said output signal from said RF port of said second of said doubly-balanced mixers as an input to said RF port of said first of said doubly-balanced mixers;

whereby said device operates as an MPL memory element for said biphase-encoded signal.

5. The device defined in claim 3, wherein:

said biphase-encoded signal applied by said first means as an input to said RF port of said first of said doubly-balanced mixers is in the form of a transient burst of said first specified frequency; and said device further comprises a capacitance for storing the polarity of the signal derived on said directly-connected IF ports of said first and second doubly-balanced mixers;

whereby said device operates as an MPL sample-and-hold circuit for temporarily storing the binary value represented by said transient biphase-encoded signal.

6. The device defined in claim 1 capable of implementing an MPL EXCLUSIVE OR, further comprising:

first means for applying a first biphase-encoded signal of said first specified frequency as an input to said RF port of said first of said doubly-balanced mixers, said first biphase-encoded signal representing the value state of a first binary bit;

second means for applying a second biphase-encoded signal of said first specified frequency as an input to said LO port of said first of said doubly-balanced mixers, said second biphase-encoded signal representing the value state of a second binary bit;

third means for applying said second specified frequency having a specified phase as a pump frequency input to said LO port of said second of said doubly-balanced mixers; and fourth means for extracting an output signal of said second specified frequency from said RF port of said second of said doubly-balanced mixers having a phase determined by the respective phases of said first and second biphase-encoded signals which is either substantially in-phase or substantially 180° out-of-phase with said specified phase dependent on whether the respective phases of each of said first and second biphase-encoded signals are the same as one another or are different from one another;

whereby said output signal from said fourth means represents a binary bit having a value state which is an MPL EXCLUSIVE OR of the respective value states of said first and second binary bits.

7. The device defined in claim 6, wherein:

said first and second specified frequencies are the same as one another.

8. A device capable of implementing an MPL FULL ADDER responsive to three biphase-encoded input signals of the same given frequency that respectively represent a first addend, a second addend and an input-carry, wherein said device comprises:

first and second pairs of first and second doubly-balanced mixers wherein each of said mixers of each of said first and second pairs includes an RF port, a local-oscillator (LO) port and an IF port, said IF port of said first of said doubly-balanced mixers of said first pair is directly connected to said IF port of said second of said doubly-balanced mixers of said first pair, and said IF port of said first of said doubly-balanced mixers of said second pair is directly connected to said IF port of said second of said doubly-balanced mixers of said second pair;

first means for applying a first of said three biphase-encoded signals as an input to said RF port of said first of said doubly-balanced mixers of said first pair;

second means for applying a second of said three biphase-encoded signals as an input to said LO port of said first of said doubly-balanced mixers of said first pair;

third means for applying a third of said three biphase-encoded signals as an input to said LO port of said second of said doubly-balanced mixers of said first pair;

fourth means for extracting a first output signal of said given frequency representing the sum output of said FULL ADDER from said RF port of said second of said doubly-balanced mixers of said first pair that has a phase determined by the respective phases of said three biphase-encoded input signals;

fifth means to which said first, second and third of said three biphase-encoded signals are applied as an input thereto, said fifth means being responsive to each of said three applied biphase-encoded signals having substantially the same given amplitude for combining said three biphase-encoded signals to derive an output signal from said fifth means having a phase corresponding to the phase of a majority of the three biphase-encoded input signals applied thereto;

sixth means for applying said output signal from said fifth means as an input to said RF port of said first of said doubly-balanced mixers of said second pair;

seventh means for applying a reference carrier of said given frequency and a given phase as an input to both said LO port of said first and second doubly-balanced mixers of said second pair; and eighth means for extracting a second output signal of said given frequency representing the output-carry of said FULL ADDER from said RF port of said second of said doubly-balanced mixers of said first pair that has a phase determined by the respective phases of said three biphase-encoded input signals.

9. The device defined in claim 8, wherein:

said fifth means includes ninth means for limiting the amplitude of said output signal therefrom to a given fixed amplitude in response to said given amplitude exceeding a given threshold value; and said given amplitude exceeds said given threshold value.

10. The device defined in claim 8, wherein:

at least one of said fourth and eighth means includes ninth means for amplifying the output signal therefrom.

* * * * *